(12) United States Patent
Jergovic et al.

(10) Patent No.: US 7,989,953 B1
(45) Date of Patent: Aug. 2, 2011

(54) FLIP CHIP POWER SWITCH WITH UNDER BUMP METALLIZATION STACK

(75) Inventors: Ilija Jergovic, Palo Alto, CA (US); Efren M. Lacap, Union City, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 12/343,372

(22) Filed: Dec. 23, 2008

Related U.S. Application Data

(60) Provisional application No. 61/017,513, filed on Dec. 28, 2007.

(51) Int. Cl.
  *H01L 23/48* (2006.01)
  *H01L 23/52* (2006.01)
  *H01L 29/40* (2006.01)
(52) U.S. Cl. .................. 257/737; 257/780; 257/E23.02
(58) Field of Classification Search .................. 257/737, 257/738, 779, 780, E23.02, E23.021
  See application file for complete search history.

(56) References Cited

U.S. PATENT DOCUMENTS

| 6,713,823 | B1 * | 3/2004 | Nickel | 257/401 |
| 7,727,879 | B2 * | 6/2010 | Lin et al. | 438/622 |
| 2006/0049483 | A1 * | 3/2006 | Lin et al. | 257/531 |
| 2008/0035959 | A1 * | 2/2008 | Jiang | 257/204 |

* cited by examiner

*Primary Examiner* — Hoai v Pham
(74) *Attorney, Agent, or Firm* — Fish & Richardson P.C.

(57) ABSTRACT

A semiconductor package includes a semiconductor substrate a semiconductor substrate having source and drain regions formed therein, an intermediate routing structure to provide electrical interconnects to the source and drain regions, a dielectric layer formed over the intermediate routing structure, and an under-bump-metallization (UBM) stack. The intermediate routing structure includes an outermost conductive layer, and the dielectric layer has an opening positioned over a portion of the intermediate layer routing structure. The UBM stack includes a conductive base layer formed over the dielectric layer and electrically connected to the outermost conductive layer through the opening, and a thick conductive layer formed on the base layer. A conductive bump is positioned on the UBM stack and laterally spaced from the opening.

26 Claims, 5 Drawing Sheets

FLIP CHIP POWER SWITCH WITH UNDER BUMP METALLIZATION STACK

CROSS-REFERENCE TO RELATED APPLICATIONS

This application claims priority to U.S. Provisional Application Ser. No. 61/017,513, filed on Dec. 28, 2007, the entire disclosure of which is incorporated by reference.

TECHNICAL FIELD

The present disclosure relates generally to integrated circuits, and in one aspect to flip chip integrated circuits.

BACKGROUND

Voltage regulators, such as DC to DC converters, are used to provide stable voltage sources for electronic systems. Switching voltage regulators are known to be an efficient type of DC to DC converter. Such voltage regulators typically include a power switch to generate a rectangular-wave voltage that is then filtered to provide the output DC voltage.

Conventionally, a power switch was fabricated on an integrated circuit chip with wire bond packaging. More recently, the power switch has been fabricated as an integrated circuit chip with flip-chip packaging.

Conductive pads are formed on at least one surface of the chip to provide electrical couplings to the integrated circuit components, e.g., transistors, internal to the chip. Traditionally, the electrical coupling between the transistors and the conductive pads is accomplished through the use of multiple conductive routing layers that are formed over the semiconducting substrate of the integrated circuit chip but below an insulative layer that supports the conductive pads and separates the pads from the routing layers (an aperture in the insulative layer can provide electrical coupling of the contact pad to the uppermost conductive routing layer). For example, an integrated circuit chip may have metal lines and vias that electrically couple the source and drain regions of the transistors to the conducting pads of the integrated circuit chip.

SUMMARY

In one aspect, a semiconductor package includes a semiconductor substrate a semiconductor substrate having source and drain regions formed therein, an intermediate routing structure to provide electrical interconnects to the source and drain regions, a dielectric layer formed over the intermediate routing structure, and an under-bump-metallization (UBM) stack. The intermediate routing structure includes an outermost conductive layer, and the dielectric layer has an opening positioned over a portion of the intermediate layer routing structure. The UBM stack includes a conductive base layer formed over the dielectric layer and electrically connected to the outermost conductive layer through the opening, and a thick conductive layer formed on the base layer. A conductive bump is positioned on the UBM stack and laterally spaced from the opening.

Implementations may include one or more of the following features. The conductive base layer may extend into the opening to contact the outermost conductive layer. The conductive base layer may be formed on the dielectric layer. A contact layer may be formed on the dielectric layer, and the contact layer may extend into the opening to contact the outermost conductive layer. The conductive base layer may be formed on the contact layer. The dielectric layer may have a plurality of openings positioned over the portion of the intermediate layer routing structure, the conductive base layer may be electrically connected to the outermost conductive layer through the openings, and the conductive bump may be laterally spaced from the openings. The conductive base layer may include at least one material selected from titanium or a nickel-vanadium alloy. The conductive base layer may be titanium and the thick conductive layer may be copper. A seed layer may be formed between the conductive base layer and the thick conductive layer. The seed layer may be the same composition as the thick conductive layer, e.g., the seed layer and the thick conductive layer may be copper. The thick conductive layer may have a thickness greater than 6 µm, e.g., a thickness greater than 9 µm, e.g., a thickness of about 9 to 14 µm. A thickness of the thick conductive layer may be sufficiently large so as to allow electrical current to propagate laterally along the surface of the thick conductive layer and through the electrical interconnects with lower resistance than conductive layers in the intermediate routing structure. The source and drain regions may be coupled to the UBM stack through short lateral interconnects in the intermediate routing structure. The dielectric layer may be a passivation layer that includes silicon-oxide or silicon-nitride materials. The substrate may include a distributed transistor and the package comprises a power switch. The source and drain regions may be part of a distributed transistor.

In another aspect, a semiconductor package includes a semiconductor substrate having source and drain regions formed therein, an intermediate routing structure to provide electrical interconnects to the source and drain regions, a dielectric layer formed over the intermediate routing structure, and an under-bump-metallization (UBM) stack. The intermediate routing structure includes an outermost conductive layer, and the dielectric layer has an opening positioned over a portion of the intermediate layer routing structure. The UBM stack includes a titanium layer formed over the dielectric layer and extending into the opening to contact the outermost conductive layer electrically, a seed layer formed on the titanium layer, and a copper layer formed on the seed layer. A conductive bump is positioned on the UBM stack and laterally spaced from the opening.

Implementations may include one or more of the following features. The substrate may include a distributed transistor and the package may provide a power switch.

In another aspect, a semiconductor package includes a semiconductor substrate having source and drain regions formed therein, an intermediate routing structure to provide electrical interconnects to the source and drain regions, a dielectric layer formed over the intermediate routing structure, and an under-bump-metallization (UBM) stack. The intermediate routing structure includes an outermost conductive layer, and the dielectric layer has a plurality of openings positioned over a portion of the intermediate layer routing structure. The under-bump-metallization (UBM) stack includes a conductive base layer formed over the dielectric layer and electrically connected to the outermost conductive layer through the openings, and a conductive layer formed on the base layer. A conductive bump is positioned on the UBM stack and laterally spaced from the openings.

Implementations can realize one or more of the following advantages. A power switch can be constructed with lower resistance and reduced power loss, and thus can handle increased current and/or have a reduced likelihood of failure. The power switch can be constructed without significant increase in processing complexity.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Flip-chip packaging is an advanced packaging design for semiconductor technology that allows an overall size of the packaged chip to be made very compact. Instead of wire bonding, flip-chip technology forms conductive bumps on the bond pads on the planar surface of an integrated circuit chip. The conductive bumps may include metals or alloys, e.g., gold, silver, aluminum, copper, brass, or tin/lead alloys, or conductive or conductor-filled epoxies. Where the chip uses ball grid array (BGA) packaging, the conductive bumps can be formed with balls of solder. The integrated circuit chip can be mounted directly on a printed circuit board (PCB) that has contact electrodes corresponding to the locations of the conductive bumps. Alternatively, the integrated circuit chip can be mounted on a specialized lead frame having contact terminals corresponding to the placement of the conductive bumps. In general, the integrated circuit chip is placed face-down (or "flip-chip" bonded) so that the conductive bumps can be placed on the contact electrodes of the PCB, an interposer between the chip and the PCB, or the contact terminals of the lead frame.

The conductive bumps are typically bonded to the PCB or lead frame using a reflow process. During the reflow process, the conductive bumps are heated until they flow and bond with the corresponding contact electrodes of the printed circuit board or contact terminals of the lead frame. Upon cooling, the conductive bump forms a mechanical terminal and serves as an electrical connection between the integrated circuit chip and the printed circuit board or lead frame.

Since no bonding wires are required, which would otherwise occupy a large layout space, the overall size of the flip-chip package is very compact as compared to conventional types of semiconductor device packages. In addition, a flip-chip package provides a short electrical path from external devices to the internal components of the substrate, minimizing series parasitic impedances, which is beneficial for application optimization and high volume automated production.

Figure 1:
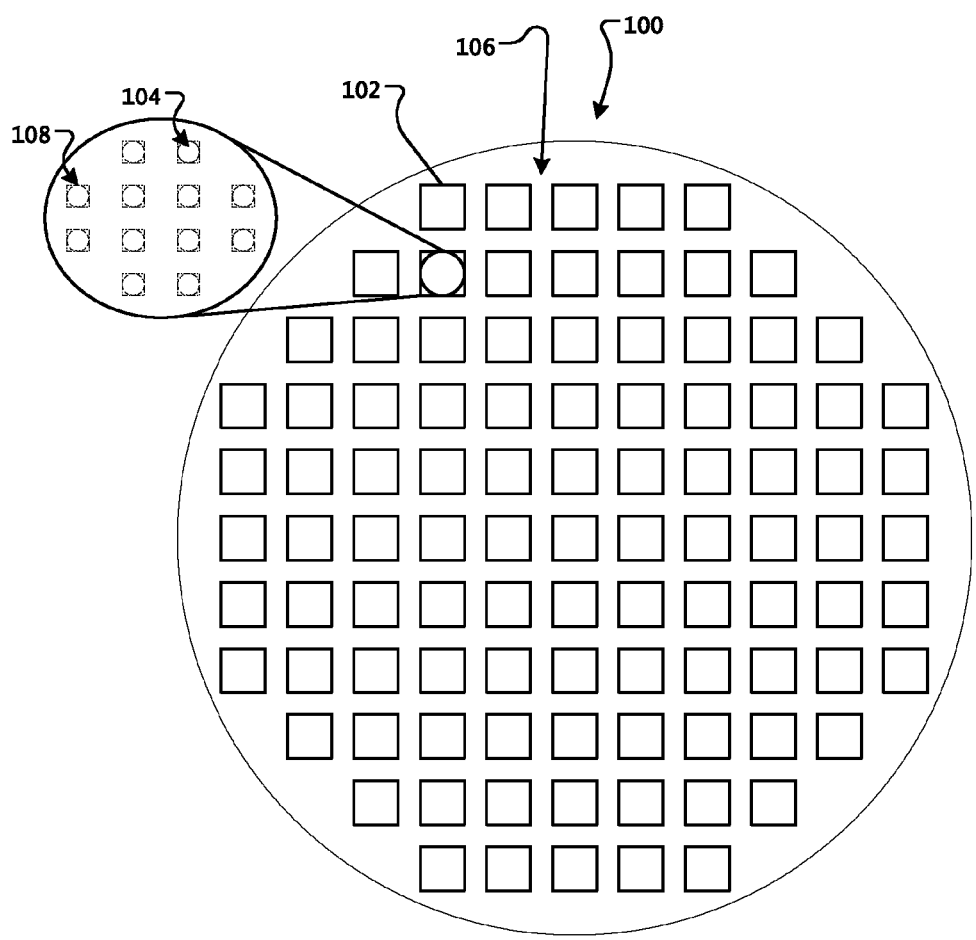
FIG. 1 is an exemplary semiconductor wafer.

FIG. 1 shows an exemplary semiconductor wafer prior to dicing. As shown, the wafer 100 includes an array of integrated circuit chips (or dice) 102, and each chip 102 includes a plurality of bond pads 108 and conductive bumps 104 to provide electrical connections between the internal semiconductor device components, e.g., transistors, and external components, e.g., other components on the PCB. Each integrated circuit chip is separated from adjacent chips by vertical and horizontal scribe lines 106.

Typically, after the semiconductor wafer 100 is fabricated and contacts (e.g., bond pads 108) are formed thereon, the wafer 100 is diced using conventional dicing machines, e.g., sawing or cutting the wafer, or other techniques, e.g., laser or etching, and singulated into individual chips along the scribe lines 106. Thus, each chip has its own semiconductor body, bond pads and conductive bumps. However, the conductive bumps can be formed on a chip after singulation.

The semiconductor wafer 100 can be a single crystal silicon body, or be formed of other materials such as gallium arsenide or silicon germanium. The bond pads 108 and conductive bumps 104 can be formed as an array of contacts, or be placed into adjacent rows and columns to form a grid or array. Although the bond pads 108 are shown as square, they can have other shapes, e.g., circular, rectangular, or other polygons. In addition, although the bond pads 108 are shown with uniform spacing in both lateral directions across the chip, other configurations and patterns are possible. For example, the pitch can be different in the different lateral directions, the spacing can be non-uniform, or there can be regions without bond pads. In one implementation, conductive bumps can be arranged, e.g., in a single or double row, around the periphery of an integrated circuit chip.

Each integrated circuit chip 102 can include one or more switching circuits each of which includes one or more switches. Each switch can be a distributed transistor, e.g., an array of parallel transistors that includes multiple doped drain and source regions. The doped regions can be arranged to form parallel stripes, a checkerboard pattern, or other patterns. The individual doped drain regions of a single distributed transistor are connected by one or more conductive layers, e.g., metal layers, to form a common drain. Similarly, the individual doped source regions of a single distributed transistor are connected by one or more conductive layers, e.g., metal layers, to form a common source. Overlying the interstitial region between the source and drain regions can be one or more gate electrodes that function to control the switching state of the distributed transistor. Further description regarding the structure of the switch, such as the configuration of the distributed transistor, can be found in, for example, U.S. Pat. No. 6,713,823 the disclosure of which is incorporated herein by reference in its entirety.

Figure 2:
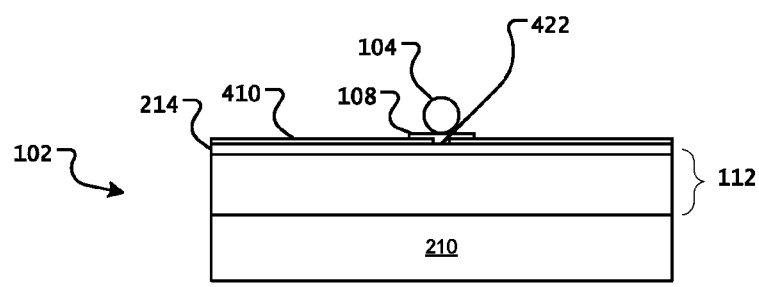
FIG. 2 is a cross section view of an exemplary integrated circuit chip with a bond pad and a conductive bump.

FIG. 2 shows a cross section view of the integrated circuit chip 102 with a bond pad 108 and conductive bump 104 (a single bond pad with a single conductive bump is illustrated for simplicity). A single conductive bump 104 can be formed on each bond pad 108, or multiple conductive bumps can be formed on each bond pad.

Referring to FIG. 2, the integrated circuit chip 102 includes a semiconductor substrate 210 in which the doped source and drain regions are formed. The integrated circuit chip 102 also includes a routing structure 112 between the bond pad 108 and the semiconductor substrate 210. The routing structure 112 includes conductive layers to provide electrical routing between the source and drain regions in the semiconductor layer 210 and the conductive bond pad 108, and insulative layers to electrically insulate the conductive layers from each other and insulate traces within a layer from each other. The routing structure 112 can include an outermost conductive layer 214, and an electrically insulative passivation layer 410 can be formed over the outermost conductive layer 214. An aperture 422 in the insulative layer 410 can permit electrical connection of the bond pad 108 to the outermost conductive layer 214.

While the conductive bump 104 is shown as a spherical ball, the conductive bump 104 also may be formed in other shapes such as, for example, stud bumps or columnar members.

Figure 4:
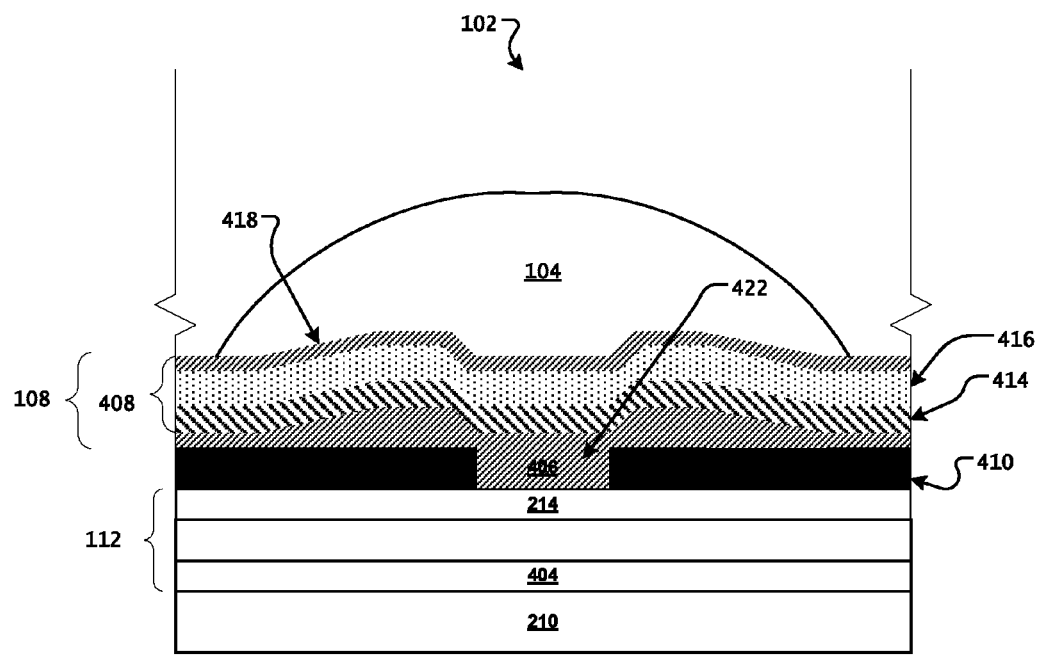
FIG. 4 is a partial cross section view of an integrated circuit chip.

The contact pad 108 facilitates the coupling between the integrated circuit chip 102 and devices and components electrically connected to the conductive bump 104. The pad can be a square, circular, rectangular, elliptical, hexagonal, octagonal, or some other shape. In some implementations, the contact pad 108 can include a multi-layered multi-stack structure. FIG. 4 shows such a structure, as will be discussed in greater detail below.

In some implementations, the integrated circuit chip 102 can include, in addition to a power switch, other functionality, such as one or more application specific devices, memory devices or control devices.

Figure 3:
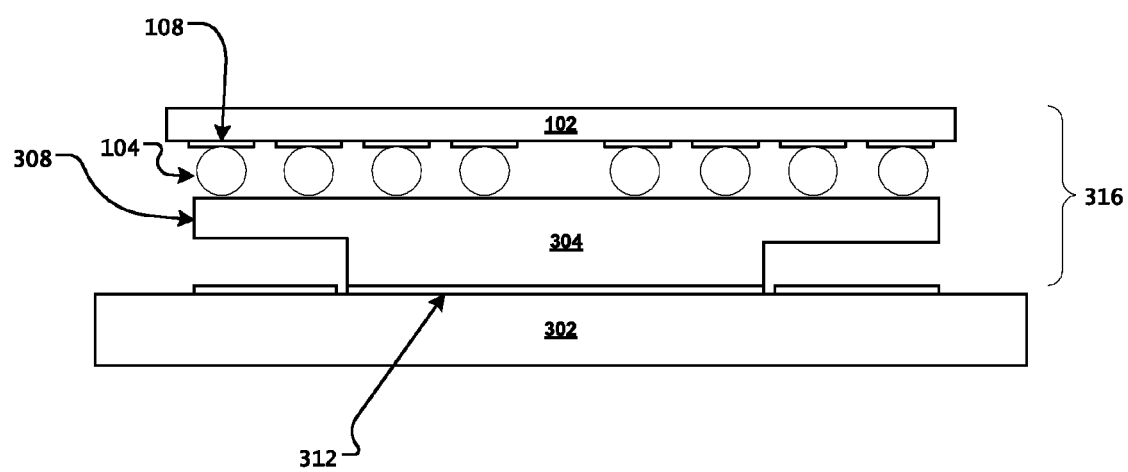
FIG. 3 is a schematic side view of an exemplary flip chip package mounted on a printed circuit board.

FIG. 3 is a schematic side view of an exemplary flip chip package 316 which includes an integrated circuit chip that can serve as a power switch, with the flip chip package mounted on a PCB 302. The mounted flip-chip package 316 includes the integrated circuit chip 102 and a lead frame 304 and is mounted on the PCB 302. Other components of the voltage regulator, such as, without limitation, output filters, interconnects and feedback circuits, can also be mounted on the PCB 302.

The lead frame 304 includes conductive leads 308. The integrated circuit chip 102, with conductive bumps 104 on contact pads 108 as shown in FIG. 2, can be attached and electrically connected to the leads 308 of the lead frame 304. Optionally, an encapsulation material (not shown) can be applied over the integrated circuit chip 102 to protect the chip against external damage. The lead frame 304 can be configured to distribute signals from the integrated circuit chip 102 to appropriate terminals 312 on the PCB 302.

The integrated circuit chip 102 can be connected to the top of the conductive leads 308 by conductive bumps 104, which may be gold, silver, aluminum, copper, brass, an alloy or eutectic of lead and tin, or another metal or metal alloy, or conductive or conductor-filled epoxies. The bottom of the lead frame 304 can be connected to the PCB 302 by additional conductive bumps, solder paste, or any other surface-mount assembly technique.

The conductive bumps 104 can be formed using known techniques such as vapor deposition of solder material or by ball bumping with wire bonding equipment. While the conductive bumps 104 are described in terms of bumps, such connotations should not be construed as imposing a specific or particular shape, and that the conductive bumps 104 can be configured as balls, columns, pillars, or other desired geometrical configurations.

FIG. 4 is a partial cross section view of an integrated circuit chip. Referring to FIG. 4, various parts and layers of the integrated circuit chip 102 are illustrated. One of ordinary skill in the art would understand that this figure depicts the integrated circuit chip prior to the attachment (e.g., to the lead frame or PCB), and some processes, such as conductive bump placement, usually proceed before such an attachment. Additionally, the relative thickness of layers and bumps shown is not drawn to scale, and is merely representative. It should be understood that the values and relationships of thicknesses of these components should not be based on those depicted in the figures.

As shown in FIG. 4, the integrated circuit chip 102 includes the substrate 210, an intermediate routing structure 112 including the outermost conductive layer 214 and a innermost conductive layer 404, a contact layer 406, and a passivation layer 410, such as a dielectric layer.

As discussed above, the substrate 210 includes a substrate, e.g., a semiconductive material, e.g., silicon or gallium arsenide, in which a number of doped regions (e.g., source regions and drain regions) of a distributed transistor may be formed. For example, the doped regions can be p-doped regions in an n-type semiconductor substrate layer or well if the distributed transistor is a PMOS transistor. As another example, the doped regions can be n-doped regions in an p-type semiconductor layer or well if the distributed transistor is an NMOS transistor. If the switch is to be an LDMOS transistor, then the drain regions can be n-doped portions in a n-type substrate or well, and the source region can include both highly p-doped and highly n-doped portions in a lightly-p-doped p-body in the n-type substrate or well.

A gate in the form of gate lines can be formed on the substrate 210. Assuming the aforementioned doped regions are arranged in a checkerboard pattern, the gate lines can surround each doped region to form a rectangular array of doped regions each separated by the gate lines. Where the doped regions are in alternating rows, the gate lines can extend in parallel between the rows. The gate lines can be formed of a conductive material, e.g., polysilicon, that is separated from the semiconductor body by an insulating layer, e.g., a gate oxide layer, such as a silicon dioxide.

Although two conductive layers of the intermediate routing structure 112 are shown, the intermediate routing structure 112 can be a single (e.g., a single conductive layer) or a multi-layered stack (e.g., two or more conductive layers) structure. For example, the intermediate routing structure 112 can include first, second and third conductive layers (with the third conductive layer being the outermost conductive layer 214), and one or more insulating layers therebetween. The conductive layers and the insulating layers may be placed in an alternating fashion.

The first conductive layer can be formed directly on the substrate 210, and the second and third conductive layers can be deposited over the first conductive layers. The conductive layers can be formed of a metal, such as aluminum or copper, and the insulating layers can be formed of an oxide, such as silicon oxide. In general, the outermost conductive layer 214 allows current to flow through the underlying conductive layers through a short path of vertical interconnects that help to reduce current flow density and resistance of interconnects, thereby reducing the power loss of the integrated circuit chip 102.

After the intermediate routing structure 112 is formed on the substrate 210, the outermost conductive layer 214 can be passivated and electrically insulated by depositing a passivation layer 410 over the surface of the outermost conductive layer 214. The passivation layer 410 can serve to separate conductive interconnect lines of the outermost conductive layer 214 from each other, and provide protection (e.g., against physical damage, moisture, external contaminants) for the integrated circuit chip 102.

The passivation layer 410 can be formed over an exposed surface of the outermost conductive layer 214. The passivation layer 410 may be formed of, for example, silicon-based materials such as silicon oxides (e.g., $SiO_2$) or silicon nitrides (e.g., SiN), or layers of other passivation materials which may be deposited by conventional sputtering or chemical vapor deposition (CVD) processes.

One or more openings 422 can be etched or otherwise patterned within a portion of the passivation layer 410 that aligns with a partial surface of the outermost conductive layer 214 such that one or more sections of the top surface of the outermost conductive layer 214 are exposed. The openings 422 can be formed by depositing, for example, a photoresist and exposing the photoresist to define the location on the passivation film 410 at which an opening is desired. The photoresist can be patterned by using conventional photolithography methods, e.g., by spinning or by laminating on a layer of photoresist, projecting light of a particular wavelength through a photomask with the desired pattern onto the photoresist to expose the photoresist to the pattern, developing the photoresist, removing the unexposed photoresist. The passivation layer 410 can be etched through holes in the photoresist to establish the opening 422, and then the remaining photoresist can be removed.

The contact layer 406, which serves as an interface between an under-bump-metallization (UBM) stack 408, also termed post-passivation metallization, and the outermost conductive layer 214, is formed atop the passivation layer 410 (in some implementations the contact layer 406 is generally not considered part of the UBM, because the contact layer can define a bond pad suitable for wire bonding, but in some implementations the contact layer 406 can be considered part of the UBM). The contact layer 406 can be provided on the passivation layer 410 such that it penetrates into the opening 422 and contacts the top surface of the outermost conductive layer 214. This establishes direct contact between the contact layer 406 and a segment of the outermost conductive layer 214.

The contact layer 406 can provide a plurality of contact pads on the surface of the integrated circuit chip 102. The contact pads can be arranged in a regular array, e.g., a rectangular array. The contact pads can be of any shape suitable (e.g., square, circular, rectangular) for attachment of the solder bump, and can be formed of a conductive material such as a metal, e.g., aluminum. The size of the contact pads may vary based on the design parameters of a particular design application, and therefore may vary between different applications. In some implementations, the contact layer 406 has a thickness of about 3 μm.

Once the contact layer is patterned, e.g., to define the contacts pads, an under-bump-metallization (UBM) stack 408 can be deposited over the passivation layer 410 and the contact layer 406. The UBM stack 408 and the layers thereof can collectively serve as a protective barrier, adhesion vehicle and wetting enhancer between the contact layer 406 and the conductive bump 104. The UBM stack 408 can be formed on the contact layer 406, and can extend in or over and around the opening 422. The UBM stack 408 can include one or more stack layers on which the conductive bump 104 is formed.

Optionally, the edges of the contact layer 406 can be covered with an additional passivation layer prior to formation of the UBM stack 408. In this case, some of the UBM stack is formed mostly directly on the contact layer 406, but some will extend onto the passivation layer.

A base layer 414 of the UBM stack 408 may be formed on the contact layer 406, and a portion thereof can align with the opening 422 of the passivation layer 410.

In the illustrative implementation, the UBM stack 408 is a three-layered structure which includes the base layer 414, a seed layer 416 and a thick conductive outer layer 418. In one implementation, the base layer 414 is formed from titanium. On the titanium layer a thin conductive seed layer 416, e.g., of copper, is deposited, e.g., by sputtering. Then a thick conductive outer layer 418 is deposited, e.g., by plating, on the seed layer. The thick conductive outer layer 418 can be a highly conductive metal of the same composition as the seed layer, e.g., copper. The thick conductive outer layer can be more than 6 microns thick, e.g., more than 9 microns thick, e.g., about 12 to 14 microns thick. The thick copper layer prevents electrical discontinuity from developing due to consumption of the copper layer during formation of the bump.

In another implementation, the UBM stack 408 is a two-layered (or more) structure. In this implementation, a conductive intermediate layer, such as nickel-vanadium alloy forms the base layer. An outer conductive layer, e.g., a copper layer, is then deposited on the intermediate layer. The copper layer can be 0.8 micron or more, e.g., up to 14 microns thick. The seed layer 416, which may include materials such as copper, can be formed on the base layer 414, e.g., by sputtering, and the thick conductive outer layer 418 can be formed, e.g., by electroplating, atop the seed layer 414. The thickness of the conductive outer layer 418 can be more than 6 microns thick, e.g., more than 9 microns thick, e.g., about 12 microns thick.

It should be understood that the UBM stack 408 may include a greater or lesser number of layers than those shown, and that each layer can include alloys of various metals or materials other than those described above. For example, in some implementations, contact layer 406 and base layer 414 can be a single layer, e.g., formed from titanium.

The UBM layers 414-418 can be formed using a suitable deposition process such as electroplating, sputtering or vapor deposition, and can be formed such that the conductive bump 104 can be properly placed thereon and adhered to the copper layer 418, resulting in a conductive bump that is electrically coupled and connected to the contact layer 406. The lateral cross-sectional area of the UBM stack 408 also can match the underlying contact layer 406, or can otherwise be of a shape suitable for attachment of the solder bump (e.g., square, circular, rectangular).

In some implementations, the thickness of the thick conductive layer 418 is sufficiently large so as to allow current to propagate laterally with lower resistance than the inner conductive layers (e.g., conductive layers other than outermost layer 214) in the intermediate routing structure 112.

The UBM stack 408 can be formed over the contact layer 406 to allow for better bonding and wetting of the conductive bump 104 to the uppermost UBM layer (e.g., copper layer 418), and for protection of the contact layer 406 and the outermost conductive layer 214 by the lowermost UBM layer (e.g., the aluminum layer 214).

As noted above, the conductive bump 104 provides an electrical connection to a PCB, an interposer between the chip and the PCB, or lead frame with flip-chip bonding. The conductive bump 104 may be formed by, for example, vapor deposition of solder material over the UBM stack 408. Alternatively, the conductive bump 104 may be formed by a solder-paste screen printing method using a photoresist mask (not shown) to guide the placement of the solder-paste. The conductive bump 104 may be formed after depositing solder materials, for example, in layers or as a homogeneous mixture, and removing the photoresist mask defining the location of the solder materials. A solder reflow process heats the solder materials (e.g., to or somewhat above a melting point) until the materials flow and bond with corresponding contact electrodes of a PCB, an interposer, or a lead frame. Upon cooling, the solder materials harden and solidify in the form of a conductive bump which serves as both mechanical and electrical connections between the carrier substrate and the semiconductor device 102. In certain implementations, increasing the number of conductive bumps can lower the resistance of the connection between the integrated circuit chip 102 and the carrier substrate to which the integrated circuit chip 102 is connected.

Figure 5:
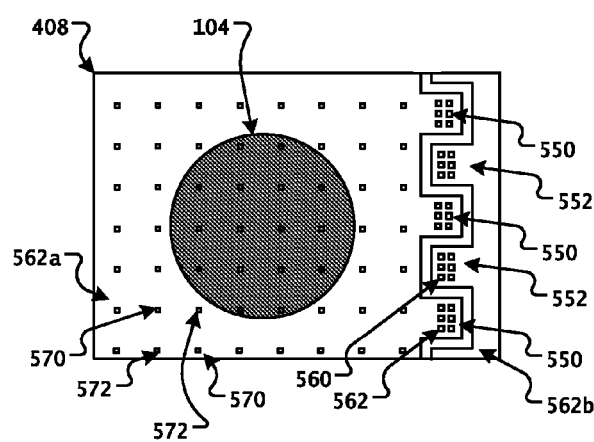
FIG. 5 is a schematic top view of an exemplary under-bump metallization layer and conductive bump.

FIG. 5 is a schematic top view of an UBM stack with a conductive bump. Referring to FIG. 5, the UBM stack 408, which overlies the outermost conductive layer 214, includes one or more first conductive areas 562a and one or more second conductive areas 562b, with the first areas 562a electrically isolated from the second areas 562b. The first conductive area 562a and the second conductive area 562b can simply be physically separated structures on the top surface of the integrated circuit chip (e.g., separated by an air gap), or an insulation layer can be provided in the lateral space between the two areas 562a and 562b.

Multiple vias, e.g., vias 570 and 572, between the UBM stack 408 and the buried conductive layers inside the intermediate routing structure 112 can be provided by apertures in the passivation layer 410 (e.g., opening 422) that connect to conductive islands in the outermost conductive layer 214, which are connected by further vias to the buried conductive layers. Vias 570 and 572 can be connected to different buried layers in the routing structure 112 (e.g., vias 570 can be connected a first conductive layer and vias 572 can be connected to a second conductive layer). At least some of the vias 570 and 572 are not directly under the conductive bump 104.

An edge of the first conductive area 562a adjacent the second conductive area 562b has one or more lateral protrusions 550, e.g., as a plurality of rectangular protrusions that extended toward the second conductive area 562b. Similarly, an edge of the second conductive area 562b adjacent the first conductive area 562a has one or more lateral protrusions 552, e.g., a plurality of rectangular protrusions that extended toward the first conductive area 562a. The rectangular protrusions of the two conductive areas can interlace in an alternating pattern to form a region of interdigitated protrusions at the common edge of the conductive areas 562a and 562b.

The first conductive area 562a of the UBM stack 408 may substantially overlap a first conductive region of the outermost conductive layer 214, and the second conductive region 564b of the UBM stack 408 may substantially overlap a second conductive region of the outermost conductive layer 214.

The integrated circuit structure as described herein can couple the source and drain regions of the distributed transistor to conductive planes of the UBM stack 408 with short lateral interconnects in the conductive layers inside the routing structure 112. Because the outermost conductive layer 214 and the UBM stack 408 can be relatively thick, they can carry large amounts of current (in comparison to the other buried conductive layers inside the routing structure 112). In particular, the UBM stack 408 can carry current laterally to vias (e.g., vias that are not directly under the conductive bump 104) with lower resistance than the other buried conductive layers (e.g., innermost conductive layer 404) inside the routing structure 112. The planar current flow in the outermost conductive layer 214 and the UBM stack 408 and the short path of direct vertical interconnects reduce the current flow density and resistance of interconnects. The design of the UBM stack 408 can therefore reduce power loss of the integrated circuit chip 102 and improves the reliability of circuits and devices coupled to the chip 102. If conducting pads can be placed above the functional area of the integrated circuit chip 102, the area necessary for providing conducting pads on the integrated circuit chip 102 can be reduced and cheaper dice in a smaller package than a traditional integrated circuit structure can be realized.

Figure 6:
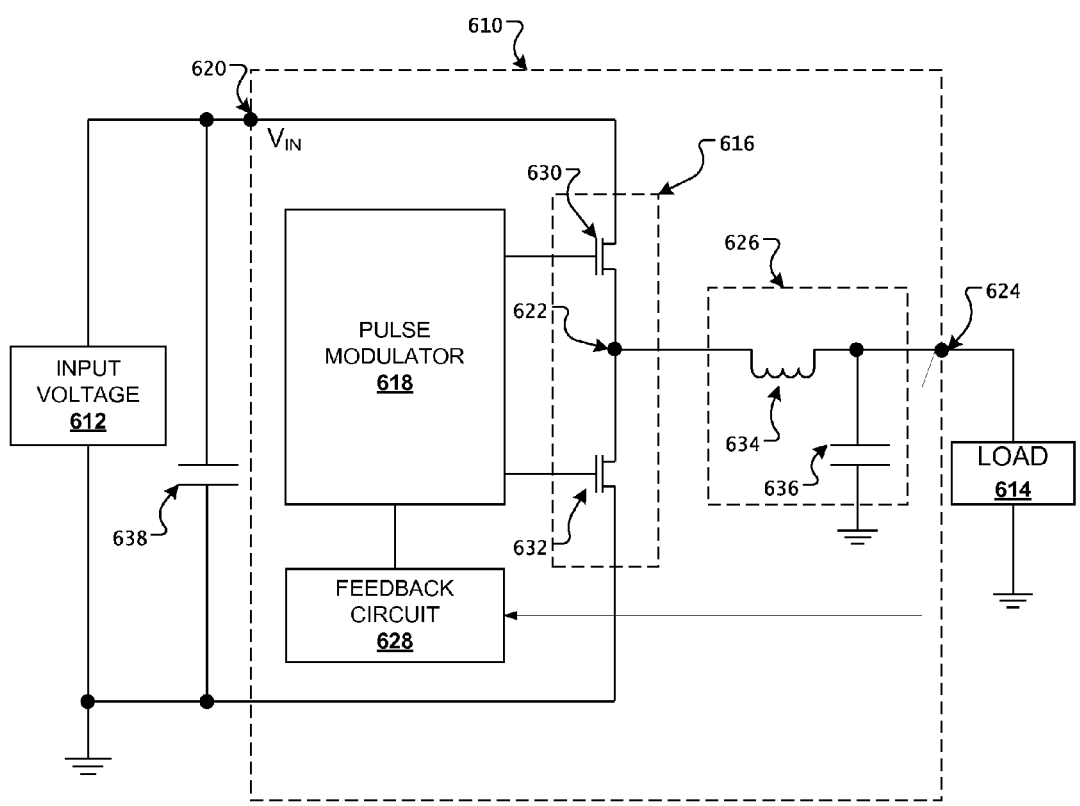
FIG. 6 is a block diagram of an exemplary switching regulator.

FIG. 6 is a block diagram of an exemplary switching regulator. Referring to FIG. 6, an implementation of a switching regulator 610 can be coupled to a DC input voltage source 612, such as a battery, by an input terminal 620. The switching regulator 610 also can be coupled to a load 614, such as an electronic device, by an output terminal 624.

The switching regulator 610 serves as a DC-to-DC converter between the input terminal 620 and the output terminal 624. The switching regulator 610 includes a switching circuit 616 that serves as a power switch for alternately coupling and decoupling the input terminal 620 to an intermediate terminal 622. The switching circuit 616 can include a rectifier, such as a switch 632 or diode, coupling the intermediate terminal 622 to ground.

The switching circuit 616 and the output filter 626 may be configured in a buck converter topology with a first transistor 630 connected between the input terminal 620 and the intermediate terminal 622 and a second transistor 632 connected between ground and the intermediate terminal 622. The switching regulator 610 may also include an input capacitor 638 connected between the input terminal 620 and ground.

The switching regulator also includes a controller assembly with a pulse modulator 618 for controlling the operation of the switching circuit 616. The pulse modulator 618 causes the switching circuit 616 to generate an intermediate voltage having a rectangular waveform at the intermediate terminal 622. Although the pulse modulator 618 and the switching circuit 616 are illustrated and described below as a pulse width modulator, various pulse frequency modulation schemes also are contemplated.

The intermediate terminal 622 can be coupled to the output terminal 624 by an output filter 626. The output filter 626 converts the rectangular waveform of the intermediate voltage at the intermediate terminal 622 into a substantially DC output voltage at the output terminal 624. Specifically, in a buck-converter topology, the output filter 626 includes an inductor 634 connected between the intermediate terminal 622 and the output terminal 624 and a capacitor 636 connected in parallel with the load 614.

During a first conduction interval, the input voltage source 612 supplies energy to the load 614 and the inductor 634 via the first transistor 630. On the other hand, during a second conduction interval, transistor 632 is closed and the inductor 634 supplies the energy. The resulting output voltage $V_{out}$ can be a substantially DC voltage. Although the switching circuit 616 and the output filter 626 are illustrated in a buck converter topology, other switching voltage regulator topologies, such as a boost converter topology, a buck-boost converter topology or various transformer-coupled topologies, also are applicable.

The output voltage can be regulated, or maintained at a substantially constant level, by a feedback loop in the controller assembly that includes a feedback circuit 628. The feedback circuit 628 includes circuitry that measures the output voltage and/or the current passing through the output terminal. The measured voltage and current are used to control the pulse modulator 618 so that the output voltage at the output terminal 624 remains substantially constant.

The conductive routings as described herein can be used in the switching circuit 616 to provide a flip-chip package that includes the switching circuit 616 and provides external couplings. In general, each switch (e.g., transistors 630 and 632) in the switching circuit 616 can be fabricated as a distributed array of parallel transistors, and the conductive routing structures discussed above can carry current from the doped source and drain regions of the switches to the conducting pads on the surface of an integrated circuit chip that encompasses the switches.

For example, if transistor 632 is implemented as an n-channel device, it can include rectangular n-doped source regions and drain regions laid out in a checkerboard pattern in a p-type well or substrate. Transistor 630 may be constructed similarly. If transistor 630 is implemented as a p-channel device, it can include alternating rectangular p-doped source regions and drain regions in an n-type well or substrate. If transistor 630 is implemented as an n-channel device, it can include alternating rectangular n-doped source regions and drain regions in a p-type well or substrate. A grid-like gate may be implemented to separate each pair of source and drain regions. Electrical connection to the gate can be provided at the peripheral edge of the chip.

Figure 7:
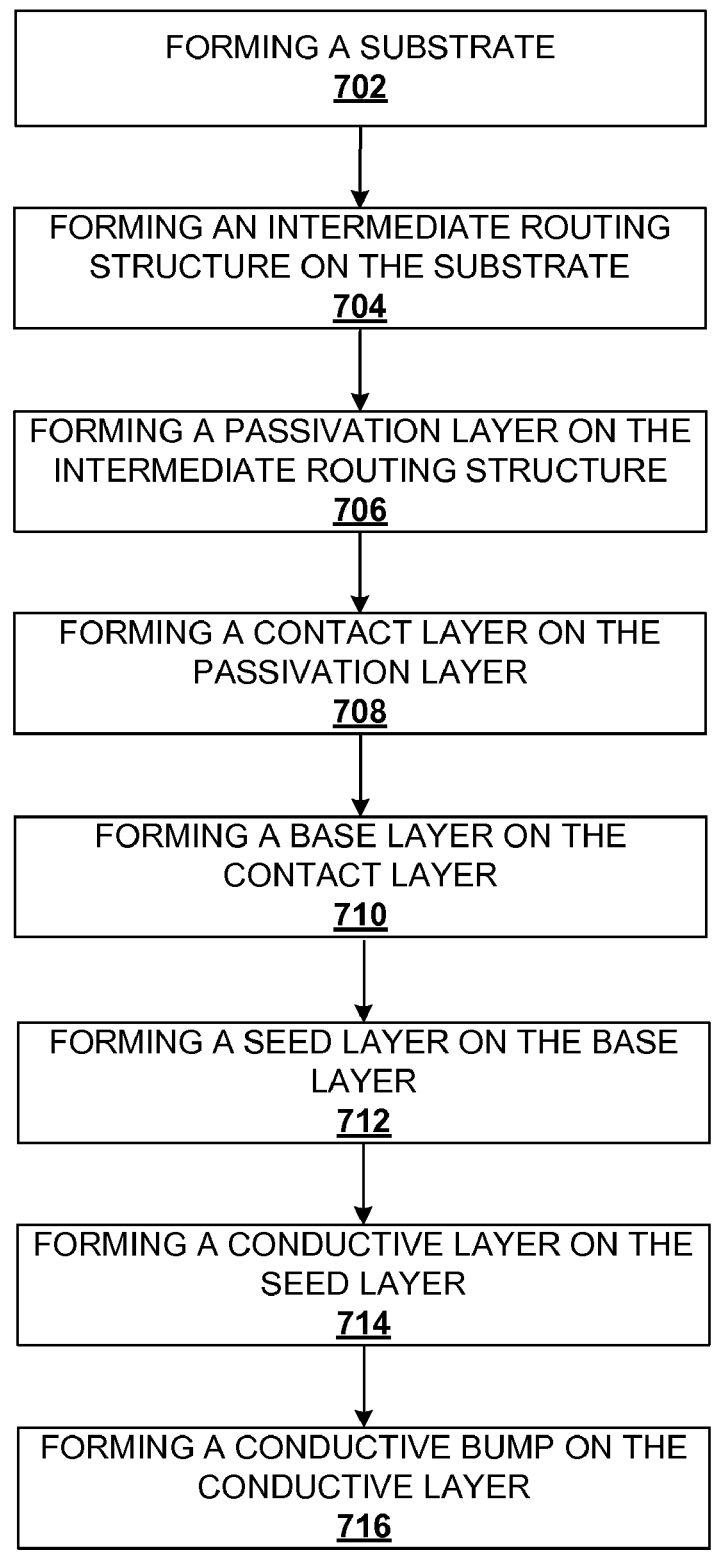
FIG. 7 is a flow chart for fabricating an integrated circuit chip shown in FIG. 4.

FIG. 7 shows a process for fabricating the integrated circuit chip 102 shown in FIG. 4. Referring to FIG. 7, the process begins with forming one or more transistors on a substrate (step 702).

An intermediate routing structure is formed on the substrate (step 704). The intermediate routing structure may be a multi-layered structure that includes conductive and insulating layers stacked in a configuration that allows electrical current to travel to the substrate.

A dielectric layer is formed on the intermediate routing structure (step 706). The dielectric layer can be a passivation film that includes insulating properties. In some implementations, the dielectric layer may include silicon-based materials such as silicon oxides or silicon nitrides, which may be deposited by conventional sputtering or chemical vapor deposition processes. The passivation layer can be patterned to create one or more openings to expose a portion of the outermost conductive layer of the intermediate routing structure. For example, the passivation layer can be pattered by applying a photoresist mask and then etching exposed portions of the passivation layer. The passivation layer may be patterned to fit a design profile for conductive bump placement. For example, the passivation may be patterned to create an opening having a circular, elliptical or oval shape.

Next, a contact layer is formed on the dielectric layer (708). The contact layer may be in a form of a contact pad that contains aluminum. The contact layer may be formed over the exposed portion of the intermediate layer and coupled to integrated circuit structures within the substrate.

Then the UBM stack is formed. The UBM stack may be a two or three layered stack, and can function to provide barrier properties for the underlying layers and pads. The UBM stack may be formed by using conventional vapor deposition and electroplating techniques. In some implementions, forming the UBM includes forming a metal base layer on the contact layer (710), forming a seed layer on the first metal layer (712) and forming a second metal layer on the seed layer (714). In some implementations, the first metal layer is titanium, the seed layer is a first copper layer deposited by sputtering, and the second metal layer is a thick copper layer deposited by plating.

A conductive bump is formed on the second metal layer (716). The conductive bump may include one or more layers of solder-wettable material or other conductive materials. The conductive bump may be formed using known techniques such as screen printing. The conductive bump may be in the form of a ball, column, pillar or other geometrical shape. The conductive bump may be provided by applying a solder mask over the second metal layer. The solder mask may be spun on or may be a dry film laminate applied by a squeegee or a paste applied with a stencil, or an ink material applied by screen printing. The conductive bump may be provided after patterning the solder mask.

The implementations as described above, and variations thereof, provide wafer-level or chip-scale packaging for integrated circuit chips and dice. Although the above implementations have been depicted and described with respect to the illustrated figures, various additions, deletions and modifications also are contemplated within its scope, and it should be understood that various modifications may be made without departing from the spirit and scope of the invention. For example, although only a single contact pad, UBM stack and conductive bump are shown for purposes of illustration, any integrated circuit chip and package can contain more than one of these components. As another example, while a layer of aluminum, a layer of nickel-vanadium and a copper layer have been disclosed as exemplary UBM layers, other metals and alloys also may be implemented for use in such layers. Accordingly, other implementations are within the scope of the following claims.

What is claimed is:

1. A semiconductor package, comprising:
a semiconductor substrate having source and drain regions formed therein;
an intermediate routing structure to provide electrical interconnects to the source and drain regions, the intermediate routing structure including an outermost conductive layer;
a passivation layer formed over the intermediate routing structure, the passivation layer having a plurality of openings positioned over a portion of the intermediate layer routing structure;
an under-bump-metallization (UBM) stack including
a conductive base layer formed over the passivation layer and electrically connected to the outermost conductive layer through the plurality of openings in the passivation layer, and
a conductive layer formed on the base layer, the conductive layer being thicker than the base layer; and
a conductive bump positioned on and directly contacting the UBM stack and laterally spaced from an opening of the plurality of openings in the passivation layer such that at least one opening of the plurality of openings is not directly under a region of contact between the conductive bump and the UBM stack and at least another opening of the plurality of openings is directly under the region of contact between the conductive bump and the UBM stack.

2. The semiconductor package of claim 1, wherein the conductive base layer extends into the opening to contact the outermost conductive layer.

3. The semiconductor package of claim 2, wherein the conductive base layer is formed directly on the passivation layer.

4. The semiconductor package of claim 1, further comprising a contact layer formed on the passivation layer, the contact layer extending into the opening to contact the outermost conductive layer.

5. The semiconductor package of claim 4, wherein the conductive base layer is formed on the contact layer.

6. The semiconductor package of claim 1, wherein the conductive base layer includes at least one material selected from titanium or a nickel-vanadium alloy.

7. The semiconductor package of claim 6, wherein the conductive base layer consists of titanium and the conductive layer consists of copper.

8. The semiconductor package of claim 1, further comprising a seed layer formed between the conductive base layer and the conductive layer.

9. The semiconductor package of claim 8, wherein the seed layer includes a same composition as the conductive layer.

10. The semiconductor package of claim 8, wherein the seed layer and the conductive layer consist of copper.

11. The semiconductor package of claim 1, wherein the conductive layer has a thickness greater than 6 μm.

12. The semiconductor package of claim 11, wherein the conductive layer has a thickness greater than 9 μm.

13. The semiconductor package of claim 12, wherein the conductive layer has a thickness of about 9 to 14 μm.

14. The semiconductor package of claim 1, wherein a thickness of the conductive layer is sufficiently large so as to allow electrical current to propagate laterally along the surface of the conductive layer and through the electrical interconnects with lower resistance than conductive layers in the intermediate routing structure.

15. The semiconductor package of claim 1, wherein the source and drain regions are coupled to the UBM stack through short lateral interconnects in the intermediate routing structure.

16. The semiconductor package of claim 1, wherein the passivation layer includes silicon-oxide or silicon-nitride materials.

17. The semiconductor package of claim 1, wherein the substrate includes a distributed transistor and the package comprises a power switch.

18. The semiconductor package of claim 1, wherein the source and drain regions are part of a distributed transistor.

19. The semiconductor package of claim 1, wherein the conductive base layer comprises a titanium layer, wherein the UBM stack further comprises a copper seed layer formed on the titanium layer, and wherein the conductive layer comprises a copper layer formed on the seed layer, the copper layer having a thickness of about 9 to 14 microns.

20. A semiconductor package, comprising:
   a semiconductor substrate having source and drain regions formed therein;
   an intermediate routing structure to provide electrical interconnects to the source and drain regions, the intermediate routing structure including an outermost conductive layer;
   a passivation layer formed over the intermediate routing structure, the passivation layer having a plurality of openings positioned over a portion of the intermediate layer routing structure;
   an under-bump-metallization (UBM) stack including
      a conductive base layer formed over the passivation layer and electrically connected to the outermost conductive layer through the openings in the passivation layer, and
      a conductive layer formed on the base layer; and
   a conductive bump positioned on and directly contacting the UBM stack and laterally positioned relative to the openings such that at least one opening of the plurality of openings is not directly under a region of contact between the conductive bump and the UBM stack and at least another opening of the plurality of openings is directly under a region of contact between the conductive bump and the UBM stack.

21. The semiconductor package of claim 20, wherein each opening of multiple openings from the plurality of openings is not directly under a region of contact between the conductive bump and the UBM stack.

22. The semiconductor package of claim 20, wherein the conductive bump is solder.

23. The semiconductor package of claim 22, wherein the conductive bump is a solder ball.

24. The semiconductor package of claim 20, wherein the conductive bump is copper.

25. The semiconductor package of claim 24, wherein the conductive bump is a copper pillar.

26. The semiconductor package of claim 20, wherein the conductive base layer comprises a titanium layer, wherein the UBM stack further comprises a copper seed layer formed on the titanium layer, and wherein the conductive layer comprises a copper layer formed on the seed layer, the copper layer having a thickness of about 9 to 14 microns.

* * * * *

UNITED STATES PATENT AND TRADEMARK OFFICE
CERTIFICATE OF CORRECTION

| | |
|---|---|
| PATENT NO. | : 7,989,953 B1 |
| APPLICATION NO. | : 12/343372 |
| DATED | : August 2, 2011 |
| INVENTOR(S) | : I. Jergovic et al. |

It is certified that error appears in the above-identified patent and that said Letters Patent is hereby corrected as shown below:

Title page, Column 2, line 2 of the printed patent, before "having" delete "a semiconductor substrate".

Signed and Sealed this
Fourth Day of October, 2011

David J. Kappos
*Director of the United States Patent and Trademark Office*